United States Patent
Paik (10) Patent No.: US 11,341,011 B2
(45) Date of Patent: May 24, 2022

(54) REPAIR CIRCUIT AND MEMORY DEVICE INCLUDING THE SAME

(71) Applicant: SK hynix Inc., Gyeonggi-do (KR)

(72) Inventor: Woo Hyun Paik, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/136,488

(22) Filed: Dec. 29, 2020

(65) Prior Publication Data

US 2021/0279154 A1 Sep. 9, 2021

(30) Foreign Application Priority Data

Mar. 9, 2020 (KR) .................. 10-2020-0029088

(51) Int. Cl.
*G06F 11/20* (2006.01)

(52) U.S. Cl.
CPC ...... *G06F 11/2094* (2013.01); *G06F 2201/85* (2013.01)

(58) Field of Classification Search
CPC .............. G06F 11/2094; G06F 2201/85
USPC ........................................ 714/6.13
See application file for complete search history.

(56) References Cited

U.S. PATENT DOCUMENTS

| 10,998,081 B1 * | 5/2021 | Park ................ G11C 29/783 |
| 2003/0123301 A1 * | 7/2003 | Jang ................ G11C 29/785 |
| | | 365/200 |
| 2016/0307647 A1 * | 10/2016 | Morgan .............. G11C 29/787 |
| 2019/0237154 A1 * | 8/2019 | Choi ................. G11C 29/4401 |
| 2020/0117558 A1 * | 4/2020 | Wilson ............. G06F 11/0751 |
| 2020/0176072 A1 * | 6/2020 | Nale .................. G11C 29/76 |
| 2020/0219581 A1 * | 7/2020 | Wieduwilt ........... G11C 8/12 |
| 2021/0026542 A1 * | 1/2021 | Carlson ............. G06F 3/0622 |

FOREIGN PATENT DOCUMENTS

| KR | 10-2001-0029312 | 4/2001 |
| KR | 10-2015-0002004 | 1/2015 |

* cited by examiner

*Primary Examiner* — Chae M Ko
(74) *Attorney, Agent, or Firm* — IP & T Group LLP (57) ABSTRACT

A repair circuit includes a plurality of storage circuits suitable for storing repair addresses according to a priority order, each of the storage circuits, among the plurality of storage circuits, storing valid information representing whether the corresponding storage circuit is valid or not and failure information representing whether the corresponding storage circuit is defective or not, and a plurality of enable signal generation circuits respectively corresponding to the plurality of storage circuits and each suitable for generating an enable signal representing whether a corresponding storage circuit is operable or not based on the valid information and the failure information of the corresponding storage circuit and a storage circuit having a preceding priority prior to the corresponding storage.

21 Claims, 4 Drawing Sheets

| Storage Unit | LAT[0] | ... | LAT[4] | LAT[5] | ... | LAT[N-1] | VAD_S | EN |
|---|---|---|---|---|---|---|---|---|
| 221 | H | ... | L | L | ... | ... | L | L |
| 222 | L | ... | L | L | ... | ... | L | L |
| 228 | H | ... | n/a | n/a | ... | ... | H | H |

# REPAIR CIRCUIT AND MEMORY DEVICE INCLUDING THE SAME

CROSS-REFERENCE TO RELATED APPLICATIONS

The present application claims priority to Korean Patent Application No. 10-2020-0029088, filed on Mar. 9, 2020, which is incorporated herein by reference in its entirety.

BACKGROUND

1. Field

Various embodiments of the present invention relate to a memory device, and more particularly, to a memory device including a repair circuit that performs a repair operation by storing a repair address.

2. Description of the Related Art

The memory device may include a plurality of memory cells that are arranged in a matrix form in a memory cell array. The increase in the memory capacity of memory devices and the progress of a fining processing technology may increase the occurrence of defects in the plurality of memory cells. In other words, as tens of millions or more of memory cells are highly integrated in one chip, the possibility of the presence of defective memory cells is increasing despite the development of the fabrication process. Even if there is only one defective memory cell among a plurality of memory cells, the memory device may not properly operate and thus the memory device may have to be abandoned as a defective memory device.

In order to improve the yield of a memory device while achieving its high integration and high speed, a method of efficiently repairing a defective memory cell may be used. For example, a memory device may include a redundancy memory cell and replace a defective memory cell with the redundant memory cell.

To this end, a memory device is provided with a fuse circuit capable of programming a repair address corresponding to a defective memory cell. For example, a laser fuse storing a logic 'high' data or a logic 'low' data according to whether the fuse is cut or not may be used. However, the laser fuse may be programmed in the stage of a wafer, but the laser fuse may not be programmed after the wafer is mounted on a package. Therefore, it is necessary to develop a technique for programming the repair addresses that occur not only after the wafer stage of a memory device but also after the production process and repairing the defective memory cells.

SUMMARY

Embodiments of the present invention are directed to a memory device capable of storing a repair address and checking whether the stored address is used or not.

In accordance with an embodiment of the present invention, a repair circuit includes: a plurality of storage circuits suitable for storing repair addresses according to a priority order, each of the storage circuits, among the plurality of storage circuits, storing valid information representing whether the corresponding storage circuit is valid or not and failure information representing whether the corresponding storage circuit is defective or not; and a plurality of enable signal generation circuits respectively corresponding to the plurality of storage circuits and each suitable for generating an enable signal representing whether a corresponding storage circuit is operable or not based on the valid information and the failure information of the corresponding storage circuit and a storage circuit having a preceding priority prior to the corresponding storage.

In accordance with an embodiment of the present invention a memory device includes: a memory cell array including a plurality of memory cells coupled between a plurality of word lines and bit lines; a plurality of storage circuits each suitable for storing a repair address of the memory cells and storing valid information representing whether the repair address is stored or not in the corresponding storage circuit; and a plurality of enable signal generation circuits respectively corresponding to the storage circuits and each suitable for generating an enable signal representing whether a corresponding storage circuit is operable or not, wherein each of the enable signal generation circuits generates a valid signal for the corresponding storage circuit based on valid information of the corresponding storage circuit and an enable signal representing whether at least one storage circuit other than the corresponding storage circuit, among the storage circuits, is operable or not.

In accordance with an embodiment of the present invention a circuitry includes: $1^{st}$ to $N^{th}$ storage circuits configured to respectively store repair addresses from most recent to least recent, each storage circuit further storing validity information and failure information; $1^{st}$ to $N^{th}$ enable signal circuits respectively corresponding to the $1^{st}$ to $N^{th}$ storage circuits and each configured to generate a validity signal and an enable signal; a determination circuit configured to sequentially determine, based on the validity signal and the failure information, whether the respective repair addresses are available; a control circuit configured to compare, for a repair operation, a row address sequentially with the respective repair addresses that are determined to be available, wherein each enable circuit generates: the validity signal based on a corresponding validity information and the enable signal generated by a subsequent enable circuit, and the enable signal based on the validity signal and a corresponding failure information.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
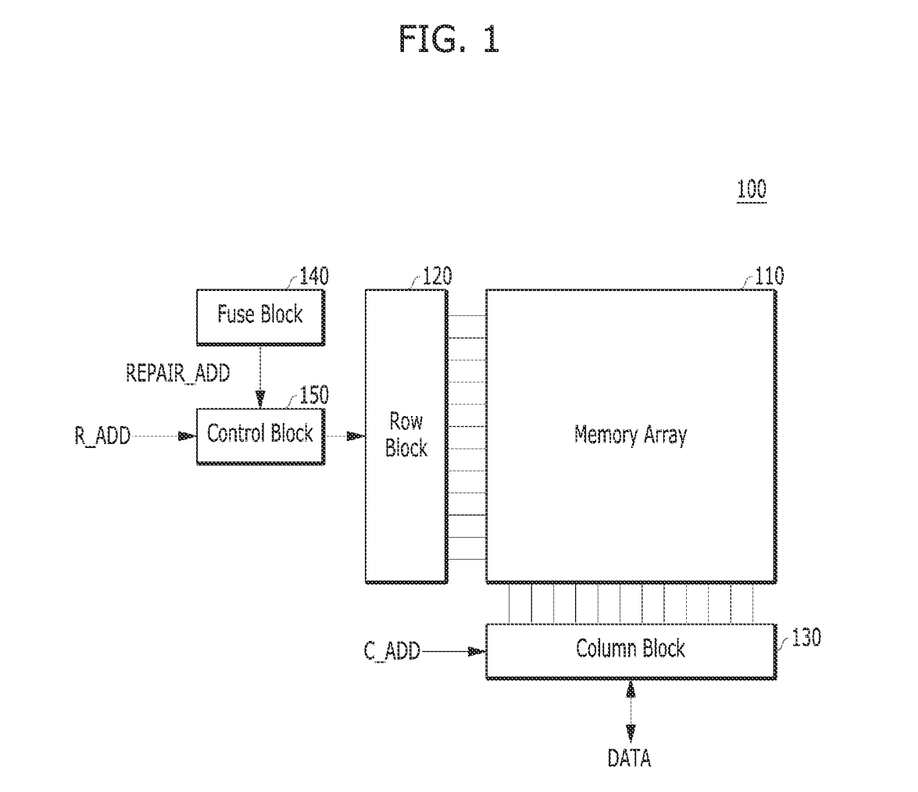
FIG. 1 is a block diagram illustrating a memory device in accordance with an embodiment.

FIG. 1 is a block diagram illustrating a memory device 100 in accordance with an embodiment. FIG. 1 illustrates a portion of the memory device 100 related to a repair operation using a row address R_ADD, but in other embodiments, the memory device 100 may include other components and may be configured in various ways depending on design.

Referring to FIG. 1, the memory device 100 may include a memory array 110, a row block 120, and a column block 130. The memory array 110 may include a plurality of memory cells that are coupled between a plurality of word lines and bit lines. When the row block 120 activates a selected word line of the memory array 110 based on a row address R_ADD, the column block 130 may read or write data DATA of a selected bit line of the memory cell array 110 based on a column address C_ADD.

The memory device 100 may further include a fuse block 140 and a control block 150 to perform a repair operation. Also, the memory array 110 may include a redundancy memory cell for replacing a defective memory cell among a plurality of memory cells together with the memory cells. The row block 120, column block 130, fuse block 140 and control block 150 may include all circuits, systems, software, firmware and devices necessary for their respective operations and functions.

The fuse block 140 may store a repair address REPAIR_ADD among the memory cells included in the memory array 110. For example, the fuse block 140 may store the row address of a defective memory cell in which a defect is detected through a test operation as the repair address REPAIR_ADD. The fuse block 140 will be described in more detail below with reference to FIG. 2.

The control block 150 may compare the repair address REPAIR_ADD stored in the fuse block 140 with the row address R_ADD input from the outside of the memory device 100. When the repair address REPAIR_ADD and the row address R_ADD are the same, the control block 150 may control the row block 120 to activate a redundant word line instead of the word line specified by the row address R_ADD. That is, the control block 150 may perform a control such that the redundant memory cell is accessed instead of the defective memory cell of the memory array 110.

Figure 2:
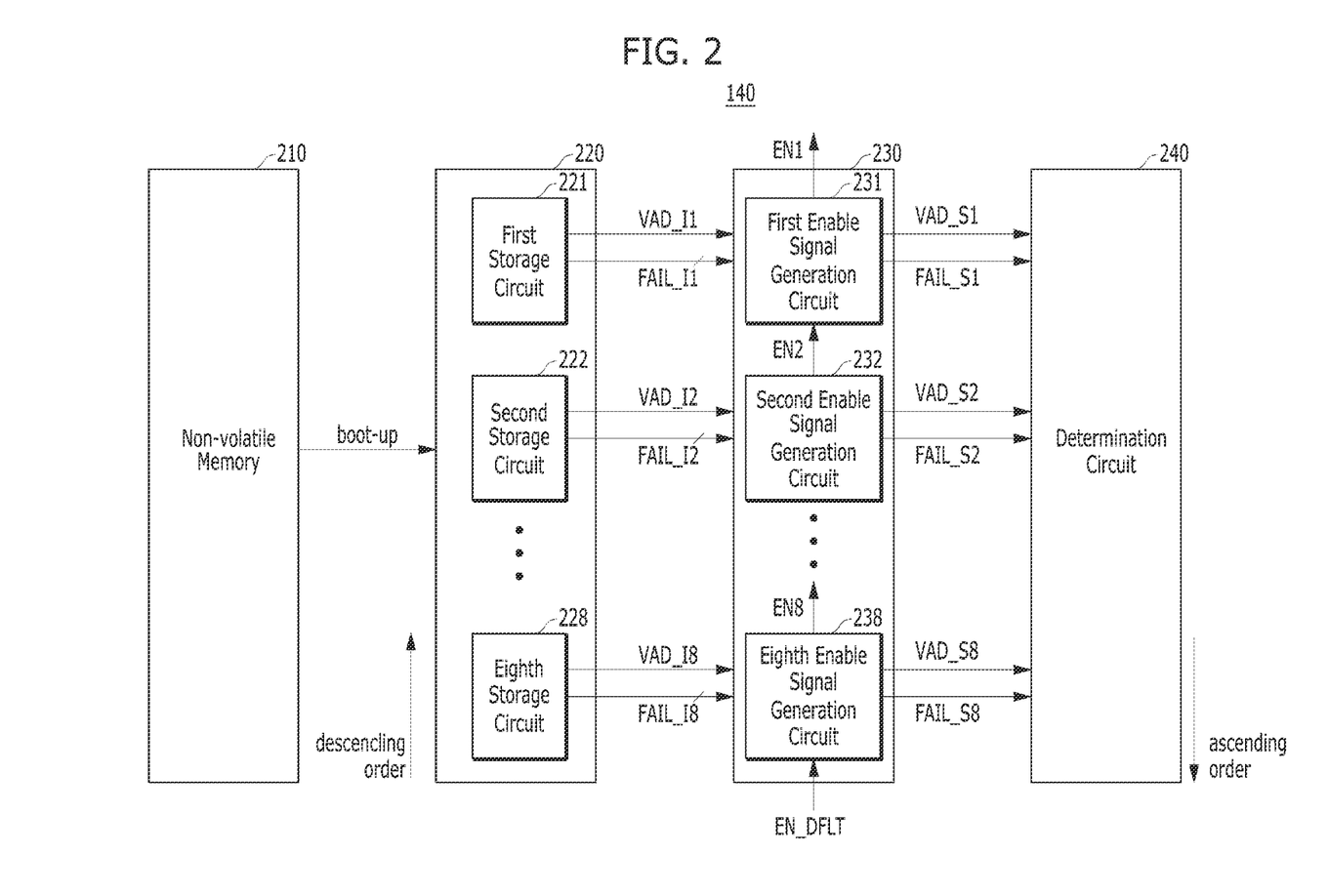
FIG. 2 is a block diagram illustrating a fuse block shown in FIG. 1.

FIG. 2 is a block diagram illustrating the fuse block 140 shown in FIG. 1. The fuse block 140 may include a nonvolatile memory 210, a storage 220, an enable signal generator 230, and a determination circuit 240.

The non-volatile memory 210 may be programmed with a repair address for a memory cell included in the memory array 110. The non-volatile memory 210 may be one of non-volatile memories, such as an e-fuse array circuit, a NAND flash memory, a NOR flash memory, a Magnetic Random Access Memory (MRAM), a Spin Transfer Torque Magnetic Random Access Memory (STT-MRAM), a Resistive Random Access Memory (ReRAM), and a Phase Change Random Access Memory (PC).

The non-volatile memory 210 may include a plurality of memory sets. Each of the memory sets may include a plurality of memory cells and may be programmed with a repair address. Each of the memory sets may be programmed with the validity of the corresponding memory set, that is, valid information representing whether the repair address is stored in the corresponding memory set or not and failure information representing whether the corresponding memory set is defective or not, along with the repair address.

When a defective memory cell is detected in the memory array 110 through a test operation even after the wafer stage, the memory device 100 may program the repair address in the non-volatile memory 210. Therefore, the memory device 100 may perform a repair operation even for the defects occurring after the wafer stage, Herein, since the non-volatile memory 210 is formed in an array, it may take a predetermined time to call data stored therein. Since it is difficult to immediately call data, the memory device 100 may transfer the repair address stored in the non-volatile memory 210 to the storage 220 through a boot-up operation, and then use the repair address stored in the storage 220 during a normal operation.

The storage 220 may include a plurality of storage circuits 221 to 228. FIG. 2 illustrates the storage 220 provided with eight storage circuits 221 to 228.

The storage circuits 221 to 228 may store the repair addresses according to a priority order. In other words, during a boot-up operation, the repair addresses stored in the non-volatile memory 210 are transferred to the storage 220, and the transferred repair addresses may be stored in a set order, for example, in a descending order of the eighth storage circuit 228 to the first storage circuit 221. That is, the eighth storage circuit 228 may have the highest priority and the first storage circuit 221 may have the lowest priority.

Each of the storage circuits 221 to 228 may store valid information to VAD_I1 to VAD_I8 representing whether the corresponding storage circuit is valid or not, that is, whether the repair address is stored in the corresponding storage circuit or not. Also, each of the storage circuits 221 to 228 may store failure information FAIL_I1 to FAIL_I8 representing whether the corresponding storage circuit is defective or not. During a boot-up operation, the valid information and failure information of the memory sets in the non-volatile memory 210 may be transferred and stored as the valid information VAD_I1 to VAD_I8 and the failure information FAIL_I1 to FAIL_I8. The valid information VAD_I1 to VAD_I8 and the failure information FAIL_I1 to FAIL_I8 may be may be updated and stored in the storage circuits 221 to 228 according to the subsequent operation.

Each of the storage circuits 221 to 228 relay include a plurality of fuse latches. The fuse latches may include a first fuse latch storing bits corresponding to the valid information VAD_I1 to VAD_I8 and second fuse latches storing a plurality of bits corresponding to a repair address.

For example, when the repair address is not stored in the first storage circuit 221, a bit of a logic low level may be stored in the first fuse latch of the first storage circuit 221, and the first valid information VAD_I1 may represent a logic low level. On the other hand, when the repair address is stored in the first storage circuit 221, a bit of a logic high level may be stored in the first fuse latch of the first storage circuit 221, and the first valid information VAD_I1 may represent a logic high level.

Likewise, when the repair addresses are not stored in the second storage circuit 222 and the eighth storage circuit 228, the second valid information VAD_I2 and the eighth valid information VAD_I8 may be at a logic low level. When the repair addresses are stored in the second storage circuit 222 and the eighth storage circuit 228, the second valid information VAD_I2 and the eighth valid information VAD_I8 may be at a logic high level.

When a storage circuit among the plurality of storage circuits 221 to 228 is defective, at least two second fuse latches among the second fuse latches of the defective storage circuit may store bits corresponding to the failure information FAIL_I1 to FAIL_I8. For example, when the first storage circuit 221 is defective, at least two second fuse latches among the second fuse latches of the first storage circuit 221 may store bits of a logic high level, and the first Failure information FAIL_I1 may represent a logic high level. Herein, the first valid information VAD_I1 of the first storage circuit 221 may represent a logic low level.

Likewise, when the second storage circuit 222 and the eighth storage circuit 228 are defective, the second failure information FAIL_I2 and the eighth failure information FAIL_I8 may be at a logic high level. The second valid information VAD_I2 and the eighth valid information VAD_I8 of the second storage circuit 222 and the eighth storage circuit 228 may be at a logic low level.

The enable signal generator 230 may include a plurality of enable signal generation circuits 231 to 238. The enable signal generation circuits 231 to 238 may respectively correspond to the storage circuits 221 to 228. The enable signal generation circuits 231 to 238 may respectively generate enable signals EN1 to EN8 representing whether the corresponding storage circuits are used or not.

In an embodiment, each of the enable signal generation circuits 231 to 238 may generate the enable signals EN1 to EN8 based on the valid informations and the failure informations of the corresponding storage circuit and the storage circuits whose order is higher than the corresponding storage circuit. To this end, each of the enable signal generation circuits 231 to 238 may generate a valid signal related to the corresponding storage circuit based on the valid information of the corresponding storage circuit and the enable signal related to the storage circuit whose order is higher than the corresponding storage circuit, and generate a failure signal related to the corresponding storage circuit based on failure information of the corresponding storage circuit. The enable signal generation circuits 231 to 238 may generate the enable signals EN1 to EN8 by combining the valid signals and the failure signals related to the corresponding storage circuits, respectively.

For example, the first enable signal generation circuit 231 may generate the first enable signal EN1 representing whether the first storage circuit 221 is used or not based on the valid informations VAD_I1 and VAD_I2 and the failure informations FAIL_I1 and FAIL_I2 of the first storage circuit 221 and the second storage circuit 222. Herein, the second storage circuit 222 may store the repair address prior to the first storage circuit 221.

The first enable signal generation circuit 231 may generate the first valid signal VAD_S1 based on the valid information VAD_I1 of the first storage circuit 221 by using the second enable signal EN2 generated based on the valid information VAD_I2 and the failure information FAIL_I2 of the second storage circuit 222. The first enable signal generation circuit 231 may generate a first failure signal FAIL_S1 based on the failure information FAIL_I1 of the first storage circuit 221, and may generate the first enable signal EN1 of the first storage circuit 221 by combining the first valid signal VAD_S1 and the first failure signal FAIL_S1.

Likewise, the second enable signal generation circuit 232 may generate the second enable signal EN2 based on the valid information and the failure information of the third storage circuit together with the valid information VAD_I2 and the failure information FAIL_I2 of the second storage circuit 222. The second enable signal generation circuit 232 may generate the second valid signal VAD_S2 based on the valid information VAD_I2 of the second storage circuit 228 and the enable signal related to the third storage circuit, and may generate the second failure signal FAIL_S2 based on the failure information FAIL_I2 of the second storage circuit 222. The second enable signal generation circuit 232 may generate the second enable signal EN2 by combining the second valid signal VAD_S2 and the second failure signal FAIL_S2.

On the other hand, the eighth enable signal generation circuit 238 may generate the eighth enable signal EN8 based on a default enable signal EN_DFLT together with the valid information VAD_I8 and the failure information FAIL_I8 of the eighth storage circuit 228. Since the eighth storage circuit 228 stores the repair address that is detected first, the eighth enable signal generation circuit 238 may use the default enable signal EN_DFLT.

The determination circuit 240 may check whether the repair addresses stored in the storage circuits 221 to 228 may be available or not in the reverse priority order based on the valid signals VAD_S1 to VAD_S8 and the failure signals FAIL_S1 to FAIL_S8. The determination circuit 240 may check whether the stored repair addresses may be available or not in the reverse order that the storage circuits 221 to 228 store the repair addresses, that is, in an ascending order of the first storage circuit 221 to the eighth storage circuit 228.

The control block 150 of FIG. 1 may sequentially compare the row addresses R_ADD with the repair addresses REPAIR_ADD that are confirmed to be available by the determination circuit 240. When it turns out as a result of the sequential comparison that a row address R_ADD and a repair address REPAIR_ADD are the same, the control block 150 may perform a control in such a manner that a redundant memory cell corresponding to the storage circuit which stores the repair address REPAIR_ADD is accessed instead of the memory cell corresponding to the row address R_ADD. Accordingly, even though the same repair address is stored in the first storage circuit 221 to the eighth storage circuit 228, a repair operation may be performed according to the last stored repair address (i.e., the repair address stored in the first storage circuit 221 of the lower priority).

Figure 3:
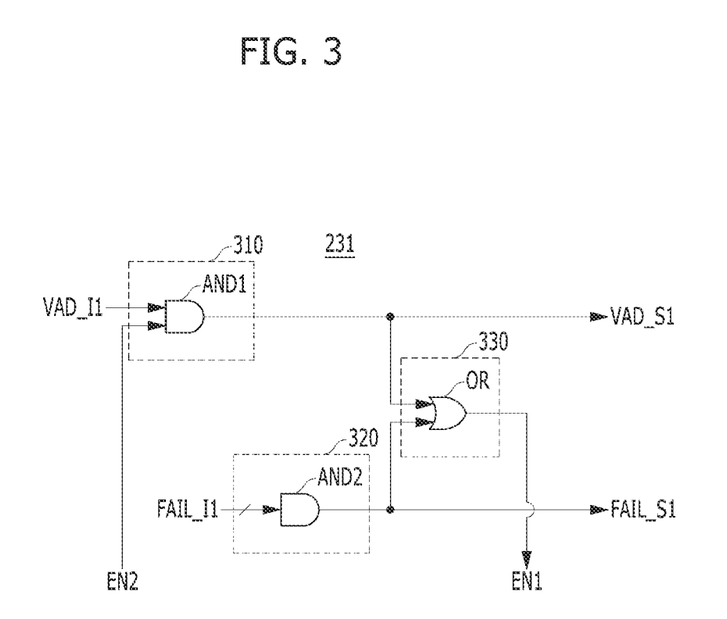
FIG. 3 is a circuit diagram illustrating a first enable signal generation circuit shown in FIG. 2.

FIG. 3 is a circuit diagram illustrating the first enable signal generation circuit 231 shown in FIG. 2. In an embodiment, the second to eighth enable signal generation circuits 232 to 238 may be realized similarly to the first enable signal generation circuit 231 of FIG. 3, for example, the input/output signals may be different.

The first enable signal generation circuit 231 may include a valid signal output circuit 310, a failure signal output circuit 320, and an enable signal output circuit 330.

The valid signal output circuit 310 may output the first valid signal VAD_S1 by combining the valid information VAD_I1 of the first storage circuit 221 and the second enable signal EN2 of the second storage circuit 222, The valid signal output circuit 310 may include a first logic gate AND1 that performs a logic operation on the valid information VAD_I1 and the second enable signal EN2 to output the first valid signal VAD_S1.

The failure signal output circuit 320 may output the first failure signal FAIL_S1 based on the failure information FAIL_I1 of the first storage circuit 221, The failure signal output circuit 320 may include a second logic gate AND2 that performs a logic operation on the failure information FAIL_I1 to output the first failure signal FAIL_S1.

The enable signal output circuit 330 may output the first enable signal EN1 of the first storage circuit 221 by combining the first valid signal VAD_S1 and the first failure signal FAIL_S1. The enable signal output circuit 330 may include a third logic gate OR that outputs the first enable signal EN1 by performing a logic operation on the first valid signal VAD_S1 and the first failure signal FAIL_S1.

Figure 4:
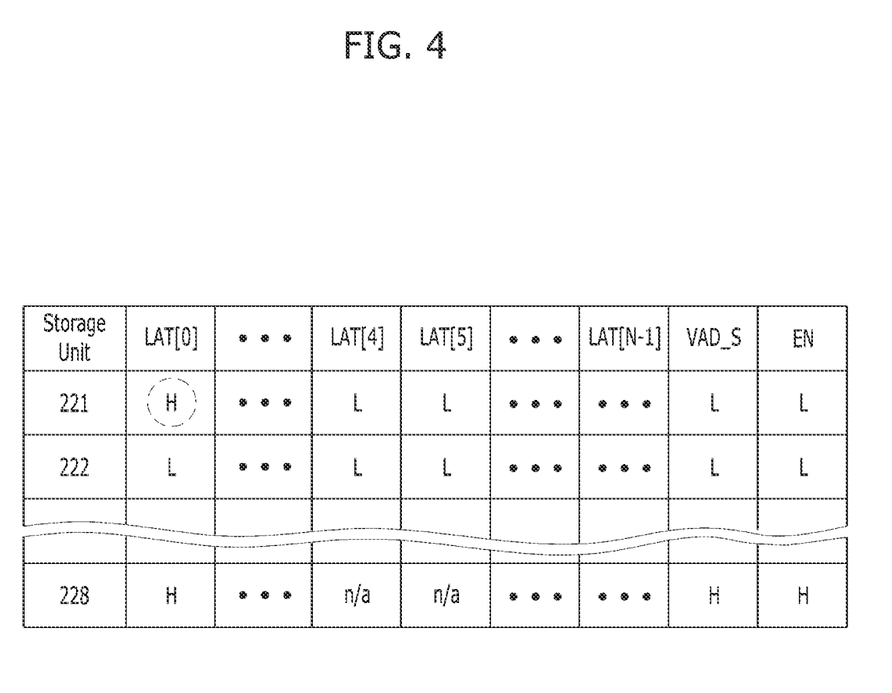
FIG. 4 illustrates an operation of a memory device in accordance with an embodiment.

FIG. 4 illustrates an operation of the memory device 100 in accordance with an embodiment.

It is illustrated as an example that each of the storage circuits 221 to 228 includes N (where N is a natural number) fuse latches LAT[0] to LAT[N-1]. The first fuse latch LAT[0] of each of the storage circuits 221 to 228 may store valid information, and the fifth fuse latch LAT[4] and the sixth fuse latch LAT[5] may store failure information.

As described above, a repair address may be stored in the eighth storage circuit 228. When the repair address is stored in the eighth storage circuit 228, the first fuse latch LAT[0] of the eighth storage circuit 228 may store valid information of a logic high level H. Accordingly, the eighth enable signal generation circuit 238 may output the valid signal VAD_S of a logic high level H to represent that the eighth storage circuit 228 stores the repair address. When the valid signal VAD_S is at a logic high level H, the eighth enable signal generation circuit 238 may generate, regardless of failure information, an enable signal EN (i.e., EN8) of a logic high level H to represent that the eighth storage circuit 228 is being used.

As shown in the second storage circuit 222, the first fuse latch LAT[0] of the second storage circuit 222 may store valid information of a logic low level L when the repair address is not stored therein. At this time, if the second storage circuit 222 has a defect, the fifth fuse latch LAT[4] and the sixth fuse latch LAT[5] of the second storage circuit 222 may store failure information of a logic high level H in a state that the first fuse latch LAT[0] stores valid information of a logic low level L. Accordingly, the second enable signal generation circuit 232 may generate an enable signal EN (i.e., EN2) of the second storage circuit 222 in additional consideration of failure information.

First, since the valid information of the second storage circuit 222 is at a logic low level L, the second enable signal generation circuit 232 may output the valid signal VAD_S of a logic low level L, regardless of the enable signal EN3 related to the third storage circuit. Herein, as shown in FIG. 4, when the fifth fuse latch LAT[4] and the sixth fuse latch LAT[5] of the second storage circuit 222 store failure information of a logic low level L, the second enable signal generation circuit 232 may generate an enable signal EN (i.e., EN2) of a logic low level L to represent that the second storage circuit 222 is not in use.

Meanwhile, when the fifth fuse latch LAT[4] and the sixth fuse latch LAT[5] of the second storage circuit 222 store failure information of a logic high level H, it does not correspond to the case that the second storage circuit 222 is not in use, but it corresponds to a case that the second storage circuit 222 is defective. Herein, the second enable signal generation circuit 232 may generate the failure signal FAIL_S2 of a logic high level H while generating the enable signal EN2 of a logic high level H. Therefore, when a defect occurs in the second storage circuit 222, it is possible to prevent the enable signal EN from becoming a logic low level L based on only valid information.

The logic levels of the fuse latches LAT[0] to LAT[N-1] included in the storage circuits 221 to 228 may change due to an error. For example, the logic levels of the fuse latches LAT[1] to LAT[N-1] of the storage circuit in which the repair address is not stored may change to a logic high level H due to an error. Since the fuse latch LAT[0] of the storage circuit still has a logic low level L, the storage circuit may be treated as a defect by changing the logic levels of the fuse latches LAT[4] and LAT[5] to a logic high level H. However, when the logic level of the fuse latch LAT[0] of the storage circuit in which the repair address is not stored change to a logic high level H, a repair operation may be performed unnecessarily according to the valid information (LAT[0]='H') of the storage circuit.

Although the first storage circuit 221 is not in use as illustrated in FIG. 4, the first fuse latch LAT[0] may store the valid information VALID_I1 of a logic high level H due to an error. According to the embodiment of the present invention, the first enable signal generation circuit 231 may block such an error and generate the valid signal VAD_S1 and the enable signal EN1 of a logic low level L.

As described above, when the second storage circuit 222 is not in use, the second enable signal generation circuit 232 may generate the enable signal EN2 of a logic low level L. Therefore, despite the error of the first fuse latch LAT[0] of the first storage circuit 221, the first enable signal generation circuit 231 may output the valid signal VAD_S1 of a logic low level L. Since the failure information FAIL_I1 of the first storage circuit 221 is also at a logic low level L, the first enable signal generation circuit 231 may generate the enable signal EN1 of a logic low level L.

According to an embodiment of the present invention, the storage circuits 221 to 228 may store repair addresses in a set order. Also, the storage circuits 221 to 228 may be accessed in the reverse order and used for a repair operation. Through this operation, even though the same repair address is stored in the storage circuits 221 to 228, a repair operation may be performed according to the last stored repair address.

Accordingly, when a repair address is not stored in a storage circuit of a preceding priority, it may mean that the storage circuit is not in use and the corresponding valid information may also represent that the storage circuit is not in use. According to an embodiment of the present invention, it is possible to prevent an error from occurring in the valid information of a storage circuit by considering the valid information of the storage circuit of a preceding priority. Also, failure information of the storage circuit of a preceding priority may be additionally combined to generate the valid information of the storage circuit.

According to various embodiments of the present invention, among the fuse circuits used in a set order, whether the fuse circuits are used or not may be checked in consideration of not only the availability of a corresponding fuse circuit but also the availability of other fuse circuits. Therefore, when an error occurs in information representing whether the fuse circuits are used or not, an enable signal for each of the fuse circuits may be generated by blocking and correcting the error that has occurred.

Furthermore, the enable signals of the fuse circuits may be generated by additionally considering information representing the defects of the fuse circuits. In this way, it is possible to prevent the fuse circuits from be used unnecessarily or performing a repair operation unnecessarily in a memory device.

While the present invention has been described with respect to the specific embodiments, it will be apparent to those skilled in the art that various changes and modifications may be made without departing from the spirit and scope of the invention as defined in the following claims.

What is claimed is:

1. A repair circuit, comprising:
   a plurality of storage circuits suitable for storing repair addresses according to a priority order, each of the storage circuits, among the plurality of storage circuits, storing valid information representing whether the corresponding storage circuit is valid or not and failure information representing whether the corresponding storage circuit is defective or not; and a plurality of enable signal generation circuits respectively corresponding to the plurality of storage circuits and each suitable for generating an enable signal representing whether a corresponding storage circuit is operable or not based on the valid information and the failure information of the corresponding storage circuit and a storage circuit having a preceding priority prior to the corresponding storage.

2. The repair circuit of claim 1,
wherein each of the enable signal generation circuits generates a valid signal for the corresponding storage circuit based on the valid information of the corresponding storage circuit and an enable signal representing whether the storage circuit having the preceding priority is operable or not, and
wherein each of the enable signal generation circuits generates a failure signal for the corresponding storage circuit based on the failure information of the corresponding storage circuit.

3. The repair circuit of claim 2, wherein each of the enable signal generation circuits generates the enable signal by combining the valid signal and the failure signal for the corresponding storage circuit.

4. The repair circuit of claim 2, wherein each of the storage circuits includes:
a first fuse latch suitable for storing a bit corresponding to the valid information; and
second fuse latches suitable for storing a plurality of bits corresponding to the repair address.

5. The repair circuit of claim 4, wherein at least two second fuse latches of a defective storage circuit among the plurality of storage circuits store bits corresponding to the failure information.

6. The repair circuit of claim 5, wherein each of the enable signal generation circuits includes:
a first logic gate suitable for performing a logic operation on an output signal of the first fuse latch and the enable signal representing whether the storage circuit having the preceding priority is operable or not to output the valid signal;
a second logic gate suitable for performing a logic operation on output signals of the at least two second fuse latches to output the failure signal; and
a third logic gate suitable for performing a logic operation on the valid signal and the failure signal to output the enable signal for the corresponding storage circuit.

7. The repair circuit of claim 5, wherein when a storage circuit among the plurality of storage circuits stores the repair address, the first fuse latch stores a bit of a logic high level.

8. The repair circuit of claim 5, wherein when a storage circuit among the plurality of storage circuits is defective, the first fuse latch stores a bit of a logic low level, and the at least two second fuse latches store a bit of a logic high level.

9. The repair circuit of claim 2, further comprising a determination circuit suitable for determining whether the repair addresses stored in the storage circuits are available or not based on the valid signal and the failure signal in a reverse order to the priority order.

10. A memory device, comprising:
a memory cell array including a plurality of memory cells coupled between a plurality of word lines and bit lines;
a plurality of storage circuits each suitable for storing a repair address of the memory cells and storing valid information representing whether the repair address is stored or not in the corresponding storage circuit; and
a plurality of enable signal generation circuits respectively corresponding to the storage circuits and each suitable for generating an enable signal representing whether a corresponding storage circuit is operable or not,
wherein each of the enable signal generation circuits generates a valid signal for the corresponding storage circuit based on valid information of the corresponding storage circuit and an enable signal representing whether at least one storage circuit other than the corresponding storage circuit, among the storage circuits, is operable or not.

11. The memory device of claim 10, wherein the storage circuits store failure information representing whether the corresponding storage circuit is defective or not.

12. The memory device of claim 11,
wherein each of the enable signal generation circuits generates a failure signal for the corresponding storage circuit based on the failure information of the corresponding storage circuit, and
wherein each of the enable signal generation circuits generates the enable signal based on the valid signal and the failure signal for the corresponding storage circuit.

13. The memory device of claim 12, wherein each of the enable signal generation circuits includes:
a valid signal output circuit suitable for outputting the valid signal by combining the valid information of the corresponding storage circuit and the enable signal representing whether the at least one storage circuit is operable or not;
a failure signal output circuit suitable for outputting the failure signal based on the failure information of the corresponding storage circuit; and
an enable signal output circuit suitable for outputting the enable signal for the corresponding storage circuit by combining the valid signal and the failure signal.

14. The memory device of claim 12, wherein the storage circuits store the repair address according to a set order.

15. The memory device of claim 14,
wherein the at least one storage circuit correspond to a storage unit storing the repair address prior to the corresponding storage circuit in the set order, among the storage circuits.

16. The memory device of claim 14, further comprising a determination circuit suitable for determining whether the repair addresses stored in the storage circuits are available or not based on the valid signal and the failure signal in a reverse order to the set order.

17. The memory device of claim 16, further comprising a control circuit suitable for sequentially comparing an input address with the repair addresses that are determined to be available by the determination circuit, and controlling a redundancy memory cell to be accessed instead of a memory cell corresponding to the input address when the input address matches with any of the repair addresses determined to be available.

18. The memory device of claim 10, wherein each of the storage circuits includes:
a first fuse latch suitable for storing a bit corresponding to the valid information of the corresponding storage circuit; and
second fuse latches suitable for storing a plurality of bits corresponding to the repair address.

19. The memory device of claim 10, further comprising a non-volatile memory including a plurality of memory sets that are programmed with the repair addresses.

20. The memory device of claim 19, wherein during a boot-up operation, the repair addresses programmed in the memory sets are transferred to and stored in the storage circuits according to a set order.

21. A circuitry comprising:
- $1^{st}$ to $N^{th}$ storage circuits configured to respectively store repair addresses from most recent to least recent, each storage circuit further storing validity information and failure information;
- $1^{st}$ to $N^{th}$ enable signal circuits respectively corresponding to the $1^{st}$ to $N^{th}$ storage circuits and each configured to generate a validity signal and an enable signal;
- a determination circuit configured to sequentially determine, based on the validity signal and the failure information, whether the respective repair addresses are available;
- a control circuit configured to compare, for a repair operation, a row address sequentially with the respective repair addresses that are determined to be available, wherein each enable signal circuit generates:
the validity signal based on a corresponding validity information and the enable signal generated by a subsequent enable signal circuit, and
the enable signal based on the validity signal and a corresponding failure information.

* * * * *